United States Patent
Nakamura et al.

(10) Patent No.: US 9,822,445 B2
(45) Date of Patent: Nov. 21, 2017

(54) METHOD FOR MANUFACTURING HEAT-RESISTANT COMPOSITE MATERIAL

(71) Applicants: IHI Corporation, Koto-ku (JP); The University of Tokyo, Bunkyo-ku (JP)

(72) Inventors: Takeshi Nakamura, Tokyo (JP); Masato Ishizaki, Tokyo (JP); Kenji Fuchigami, Tokyo (JP); Kozue Hotozuka, Tokyo (JP); Yukihiro Shimogaki, Tokyo (JP); Takeshi Momose, Tokyo (JP); Yasuyuki Fukushima, Tokyo (JP); Noboru Sato, Tokyo (JP); Yuichi Funato, Tokyo (JP); Hidetoshi Sugiura, Tokyo (JP)

(73) Assignees: IHI Corporation, Koto-ku (JP); The University of Tokyo, Bunkyo-ku (JP)

( * ) Notice: Subject to any disclaimer, the term of this patent is extended or adjusted under 35 U.S.C. 154(b) by 0 days.

(21) Appl. No.: 14/621,128

(22) Filed: Feb. 12, 2015

(65) Prior Publication Data
US 2015/0152547 A1    Jun. 4, 2015

Related U.S. Application Data

(63) Continuation of application No. PCT/JP2013/053749, filed on Feb. 15, 2013.

(30) Foreign Application Priority Data

Aug. 17, 2012  (JP) .................................. 2012-181016

(51) Int. Cl.
C23C 16/32 (2006.01)
C23C 16/04 (2006.01)
(Continued)

(52) U.S. Cl.
CPC .......... *C23C 16/325* (2013.01); *C23C 16/045* (2013.01); *C23C 16/455* (2013.01); *C23C 16/52* (2013.01)

(58) Field of Classification Search
CPC .............................. C23C 16/32; C23C 16/325
See application file for complete search history.

(56) References Cited

U.S. PATENT DOCUMENTS 3,755,541 A    8/1973 Strepkoff
4,459,338 A *  7/1984 Angelini ............... C23C 16/325
                                                         427/215
(Continued)

FOREIGN PATENT DOCUMENTS

CN    1244186 A    2/2000
CN    1906735 A    1/2007
(Continued)

OTHER PUBLICATIONS

Wang, Chih-Feng, et al., "Low pressure chemical vapor deposition of silicon carbide from dichlorosilane and acetylene". Materials Chemistry and Physics 63 (2000) 196-201.*
(Continued)

*Primary Examiner* — Bret Chen
(74) *Attorney, Agent, or Firm* — Oblon, McClelland, Maier & Neustadt, L.L.P.

(57) ABSTRACT

By using chemical vapor deposition or chemical vapor infiltration, silicon carbide is deposited on a preform 100 accommodated in a reaction furnace 11 for film formation, and the amount of additive gas added to raw material gas and carrier gas to be supplied to the reactive furnace 11 is used to control the growth rate and filling uniformity at film formation of silicon carbide. When the film formation of silicon carbide follows a first-order reaction, the amount of added additive gas is used to control the sticking probability of the film-forming species. When the film formation of
(Continued)

silicon carbide follows a Langmuir-Hinshelwood rate formula, the amount of added additive gas is used to make a control so that a zero-order reaction region of the Langmuir-Hinshelwood rate formula is used.

14 Claims, 9 Drawing Sheets

(51) Int. Cl.
*C23C 16/455* (2006.01)
*C23C 16/52* (2006.01)

(56) References Cited

U.S. PATENT DOCUMENTS

| | | | | |
|---|---|---|---|---|
| 4,772,498 | A * | 9/1988 | Bertin | B23K 20/007 219/56 |
| 5,474,613 | A * | 12/1995 | Pickering | C04B 35/571 118/715 |
| 5,612,132 | A * | 3/1997 | Goela | C04B 35/571 106/287.13 |
| 5,682,594 | A * | 10/1997 | Kennedy | B32B 18/00 428/549 |
| 5,738,908 | A | 4/1998 | Rey et al. | |
| 5,789,024 | A * | 8/1998 | Levy | B01D 53/228 210/490 |
| 5,989,340 | A * | 11/1999 | Stephani | C30B 23/00 117/106 |
| 6,025,117 | A * | 2/2000 | Nakano | C08G 77/60 216/2 |
| 6,197,374 | B1 * | 3/2001 | Huttinger | C04B 41/4531 427/249.15 |
| 6,207,305 | B1 * | 3/2001 | Nishioka | C04B 41/009 428/698 |
| 6,436,361 | B1 * | 8/2002 | Kamisuki | C04B 35/573 423/345 |
| 2004/0063984 | A1 * | 4/2004 | Shen | C07F 7/0896 556/465 |
| 2006/0060145 | A1 * | 3/2006 | Van Den Berg | C30B 31/14 118/728 |
| 2006/0121196 | A1 * | 6/2006 | Tanaka | B82Y 30/00 427/248.1 |
| 2009/0121258 | A1 * | 5/2009 | Kumar | H01L 21/26586 257/192 |
| 2010/0006859 | A1 * | 1/2010 | Chung | C30B 29/36 257/77 |
| 2010/0032857 | A1 * | 2/2010 | Izadnegahdar | B81C 99/0085 264/81 |
| 2011/0001097 | A1 * | 1/2011 | Aramata | H01M 4/0421 252/521.3 |
| 2011/0076401 | A1 * | 3/2011 | Chao | C23C 16/325 427/249.16 |
| 2011/0212599 | A1 * | 9/2011 | Kuribayashi | C23C 16/325 438/478 |
| 2012/0067274 | A1 * | 3/2012 | Hara | C23C 16/4583 117/88 |

FOREIGN PATENT DOCUMENTS

| | | |
|---|---|---|
| CN | 102517631 A | 6/2012 |
| JP | 49-037040 B1 | 10/1974 |
| JP | 02-157196 A | 6/1990 |
| JP | 2000-001398 A | 1/2000 |
| JP | 2001-508388 A | 6/2001 |
| JP | 03-380761 B2 | 12/2002 |
| JP | 2013-100608 * | 5/2013 |

OTHER PUBLICATIONS

Danielsson, Orjan, "Simulations of Silicon Carbide Chemical Vapor Deposition". Linkoping Studies in Science and Technology Dissertation No. 773, Institute of Technology, Linkoping University, 2002, pp. 1-65.*
Yang, Yan, et al., "Chemical vapor deposition of SiC at different molar ratios of hydrogen to methyltrichlorosilane". J. Cent. South Univ. Technol. (2009) 16: 0730-0737.*
International Search Report dated Apr. 2, 2013 for PCT/JP2013/053749 filed Feb. 15, 2013 with English Translation.
International Written Opinion dated Apr. 2, 2013 for PCT/JP2013/053749 filed Feb. 15, 2013.
Yasuyuki Fukusima, et al., "Multiscale Analysis of SiC-CVD Process Reaction Mechanism". SCEJ 43$^{rd}$ Autumn Meeting (Nagoya Institute of Technology, 2011).
Yasuyuki Fukusima, et al., "Multiscale Analysis (2) of SiC-CVD Process Reaction Mechanism". SCEJ 77$^{th}$ Annual Meeting (Kogakuln University, 2012).
F. Loumagne, et al., "Reactional Mechanisms of the Chemical Vapour Deposition of SiC-Bases Ceramics from $CH_3SiCl_3/H_2$ Gas Percursor", J. Crystal Growth, 155 (1995), 205.
Yingbin Ge, et al., "Theoretical Study of the Pyrolysis of Methyltrichlorosilane in the Gas Phase. 3, Reaction Rate Constant Calculations", J. Phys. Chem., 114(2010), 2384.
Extended European Search Report dated Mar. 4, 2016 in Patent Application No. 13879446.6.
Combined Chinese Office Action and Search Report dated Feb. 22, 2016 in Patent Application No. 201380042867.7 (with English translation of categories of cited documents).
George D. Papasouliotis, et al., "Experimental study of atmospheric pressure chemical vapor deposition of silicon carbide from methyltrichlorosilane" Journal of Materials Research, vol. 14, No. 8, XP002754542. Aug. 1999, pp. 3397-3409.
Hiroshi Nakagawa, et al., "Self-Ordering of Nanofacets on Vicinal SiC Surfaces" Physical Review Letters, vol. 91, No. 22, Nov. 26, 2003, pp. 226107-1-226107-4 and Cover Page.

* cited by examiner

METHOD FOR MANUFACTURING HEAT-RESISTANT COMPOSITE MATERIAL

CROSS REFERENCE TO RELATED APPLICATIONS

This application is a continuation application of International Application No. PCT/JP2013/053749 filed on Feb. 15, 2013, which claims priority to Japanese Patent Application No. 2012-181016, filed on Aug. 17, 2012, the entire contents of which are incorporated by references herein.

TECHNICAL FIELD

The present invention relates to a method and an apparatus for manufacturing a heat-resistant composite material containing silicon carbide.

BACKGROUND ART

Silicon carbide (SiC) has a high breakdown voltage and is expected as a next-generation material of power semiconductors. Moreover, silicon carbide transmits visible light, and the coefficient of thermal expansion and lattice constant thereof are close to those of gallium nitride (GaN). Accordingly, silicon carbide is widely used for substrates of GaN-based LEDs and is a promising material used for semiconductor devices and ceramics.

Such silicon carbide has excellent heat resistance and is expected to be applied to mechanical parts used at high temperature and the like. Those applications often require high mechanical strength, and silicon carbide is infiltrated into a preform made of ceramic fibers to be provided as a heat-resistant composite material with the toughness increased.

The aforementioned heat-resistant composite materials are manufactured by depositing silicon carbide on the microstructure of preforms accommodated in a reactor often by chemical vapor deposition (CVD) or chemical vapor infiltration (CVI). There are two options for the material gas of silicon carbide including: a mixture of silane ($SiH_4$) gas and hydrocarbon gas; and an organic silicon compound such as methyl trichlorosilane ($CH_3SiCl_3$: MTS).

CITATION LIST

Patent Literature

PTL1: Japanese Unexamined Patent Application Publication (Translation of PCT Application) No. 2001-508388
PTL2: Japanese Patent Publication No. 3380761

Non-Patent Literature

NPTL 1: Yasuyuki Fukusima, Kozue Hododuka, and Yukihiro Shimogaki, Multiscale analysis of SiC-CVD Process Reaction Mechanism, SCEJ 43rd Autumn Meeting (Nagoya Institute of Technology, 2011)
NPTL 2: Yasuyuki Fukusima, Yuichi Funato, Kozue Hododuka, Ken Momose, and Yukihiro Shimogaki, Multiscale analysis (2) of SiC-CVD Process Reaction Mechanism, SCEJ 77th Annual Meeting (Kogakuin University, 2012)
NPTL 3: F. Loumagne et al., J. Crystal Growth, 155 (1995), 205
NPTL 4: Yingbin Ge, Mark S. Gordon, Francine Battaglia, and Rodney O. Fox, J. Phys. Chem., 114(2010), 2384

SUMMARY OF INVENTION

Problems to be Solved by Invention

However, if the growth rate at which film of silicon carbide is formed on the microstructure of preforms is increased, the silicon carbide filling uniformity in the microstructure is degraded. On the other hand, if sufficient filling uniformity of silicon carbide is ensured, the growth rate is reduced. It is thus difficult to support high growth rate and good filling uniformity of silicon carbide at the same time.

In the process of manufacturing the heat-resistant composite material in an industrial scale, plural preforms are placed in a long reactor, and film of silicon carbide is simultaneously formed on each preform. In this case, the film formation rate is not uniform from upstream to downstream of the flow of the raw material gas in the reactor.

The present invention is made to solve the aforementioned problem, and an object of the invention is to provide a method and an apparatus for manufacturing a heat-resistant composite material which are capable of ensuring compatibility between high growth rate at which film of silicon carbide is formed on the microstructure and good filling uniformity of silicon carbide.

Another object of the present invention is to provide a method and an apparatus for manufacturing a heat-resistant composite material which are capable of forming film on plural base materials which are placed in a reactor at uniform growth rate irrespective of the position of each base material.

Means to Solve Problem

In order to solve the aforementioned problems, a method of manufacturing a heat-resistant composite material according to the application uses chemical vapor deposition or chemical vapor infiltration to cause raw material gas and carrier gas to flow in a reaction furnace accommodating a base material having a microstructure and to deposit silicon carbide on the base material for film formation. The method includes: adding additive gas to the raw material gas and carrier gas; and adjusting the amount of the added additive gas to control growth rate and filling uniformity at film formation of silicon carbide. Preferably, the reaction furnace is a hot-wall furnace.

Preferably, the film formation of silicon carbide follows a first-order reaction, and the growth rate and filling uniformity at the film formation of silicon carbide are controlled by adjusting the amount of the added additive gas to control sticking probability of a film-forming species to the base material. Preferably, the growth rate and filling uniformity at the film formation of silicon carbide are optimized.

Preferably, the film formation of silicon carbide follows a Langmuir-Hinshelwood rate formula, and the growth rate and filling uniformity at the film formation of silicon carbide are controlled by adjusting the amount of the additive gas added to make a control so that a zero-order reaction region of the Langmuir-Hinshelwood rate formula is used. Preferably, the growth rate and filling uniformity at the film formation of silicon carbide are optimized.

Preferably, the amount of the additive gas added is used to control the distribution of growth rate at the film formation of silicon carbide with respect to the position in the reaction furnace. Preferably, the distribution of growth rate is optimized to be uniform.

Preferably, the raw material gas is supplied through a plurality of positions located from upstream to downstream in the reaction furnace.

Preferably, the raw material gas includes at least one of methyltrichlorosilane, dimethyldichlorosilane, trimethylchlorosilane, silicon tetrachloride, silane, and propane. Preferably, the carrier gas includes at least one of hydrogen, nitrogen, helium, and argon.

Preferably, the additive gas includes molecules containing chlorine. Preferably, the additive gas includes at least one of hydrochloride, chlorine, methane chloride, dichloromethane, chloroform, carbon tetrachloride, vinyl chloride, benzene chloride, silicon tetrachloride, trichlorosilane, dichlorosilane, dichloroethylene, tetrachloroethane, trichloroethane, and dichloroethane.

Preferably, the additive gas includes at least one of methane, ethane, ethylene, and acetylene.

Preferably, the base material includes at least one of a preform of fibers, a substrate provided with a trench, and a porous substrate.

A heat-resistant composite material manufacturing apparatus according to the application which uses chemical vapor deposition or chemical vapor infiltration to deposit silicon carbide on a base material having a microstructure for film formation, the method includes: a reaction furnace accommodating the base material; a raw material gas supply source supplying raw material gas to the reaction furnace; a carrier gas supply source supplying carrier gas to the reaction furnace; an additive gas supply source supplying additive gas to the reaction furnace; and a controller controlling an amount of the additive gas supplied. The controller uses the amount of the added additive gas to control growth rate and filling uniformity at the film formation of silicon carbide. Preferably, the reactive furnace is a hot-wall furnace.

Preferably, the film formation of silicon carbide follows a first-order reaction, and the growth rate and filling uniformity at the film formation of silicon carbide are controlled by adjusting the amount of the added additive gas to control sticking probability of a film-forming species to the base material. Preferably, the controller optimizes the growth rate and filling uniformity at the film formation of silicon carbide.

Preferably, the film formation of silicon carbide follows a Langmuir-Hinshelwood rate formula, and the controller controls growth rate and filling uniformity at the film formation of silicon carbide by adjusting the amount of the added additive gas to make a control so that a zero-order reaction region of the Langmuir-Hinshelwood rate formula is used. Preferably, the controller optimizes the growth rate and filling uniformity at the film formation of silicon carbide.

Preferably, the controller uses the amount of the added additive gas to control the distribution of growth rate at the film formation of silicon carbide with respect to the position in the reaction furnace. Preferably, the distribution of growth rate is optimized to be uniform.

Preferably, the apparatus includes a supply path to supply the raw material gas through a plurality of positions located from upstream to downstream in the reaction furnace.

Preferably, the raw material gas includes at least one of methyltrichlorosilane, dimethyldichlorosilane, trimethylchlorosilane, silicon tetrachloride, silane, and propane. Preferably, the carrier gas includes at least one of hydrogen, nitrogen, helium, and argon.

Preferably, the additive gas includes molecules containing chlorine. Preferably, the additive gas includes at least one of hydrochloride, chlorine, methane chloride, dichloromethane, chloroform, carbon tetrachloride, vinyl chloride, benzene chloride, silicon tetrachloride, trichlorosilane, dichlorosilane, dichloroethylene, tetrachloroethane, trichloroethane, and dichloroethane.

Preferably, the additive gas includes at least one of methane, ethane, ethylene, and acetylene.

Preferably, the base material includes at least one of a preform of fibers, a substrate provided with a trench, and a porous substrate.

Preferably, the apparatus further includes: a raw material gas supply amount controller controlling the amount of the raw material gas supplied from the raw material gas supply source; a carrier gas supply amount controller controlling the amount of the carrier gas supplied from the carrier gas supply source; and an additive gas supply amount controller controlling the amount of the additive gas supplied from the additive gas supply source.

Effect of Invention

According to the present invention, it is possible to ensure the compatibility between high growth rate and good filling uniformity at film formation of silicon carbide on the microstructure. Moreover, even when plural base materials on which film of silicon carbide is to be formed are placed in a reactor, it is possible to equalize the growth rate of film formation irrespective of location.

MODES FOR CARRYING OUT INVENTION

Hereinafter, a description is given of a method and an apparatus for manufacturing a heat-resistant composite material according to the present invention in detail with reference to the drawings.

[Configuration of Manufacturing Apparatus]

Figure 1:
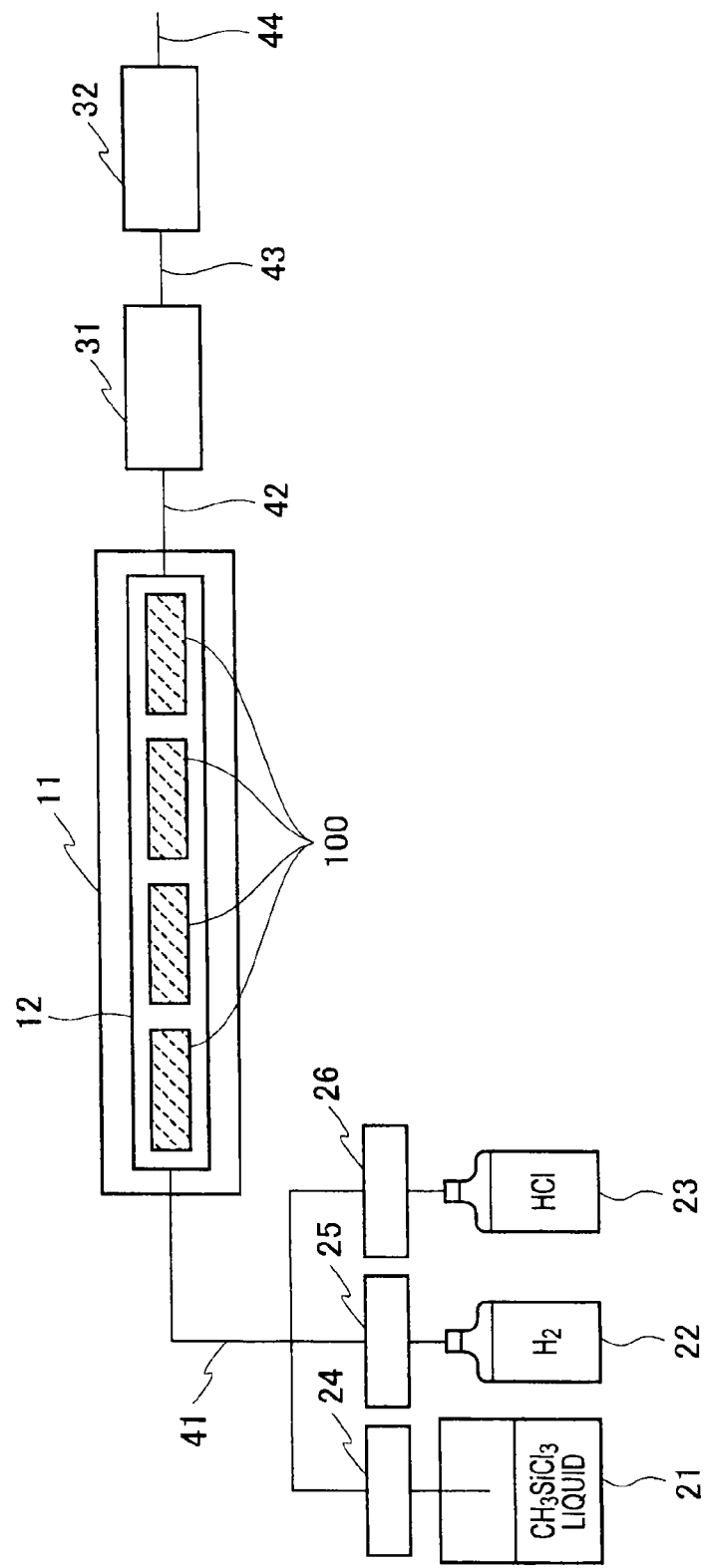
FIG. 1 is a diagram illustrating a schematic configuration of an apparatus for manufacturing a heat-resistant composite material.

FIG. 1 is a diagram illustrating a schematic configuration of the apparatus for manufacturing a heat-resistant composite material. This manufacturing apparatus constitutes a chemical vapor deposition (CVD) device or a chemical vapor infiltration (CVI) device and includes a horizontal hot-wall furnace 11 as a reaction furnace. The hot-wall furnace 11 is maintained at a predetermined temperature and a predetermined pressure and is supplied with a gas mixture including methyltrichlorosilane ($CH_3SiCl_3$: MTS) as a raw material gas, hydrogen ($H_2$) as a carrier gas, and hydrochloride (HCl) as an additive gas.

A first flow channel 41, which supplies the gas mixture from the upstream side to the hot-wall furnace 11, is supplied with MTS as the raw material gas through a raw material gas flow rate controller 24 at a predetermined flow rate. MTS is stored in a raw material gas supply source 21 in the form of liquid, and a necessary amount of MTS is gasified and provided. In a similar manner, the first flow channel 41 is supplied with hydrogen as the carrier gas from a carrier gas supply source 22 through a carrier gas flow rate controller 25 at a predetermined flow rate, and the first flow channel 41 is supplied with hydrochloride as the additive gas from an additive gas supply source 23 through an additive gas flow rate controller 26 at a predetermined flow rate.

The raw material gas, carrier gas, and additive gas flow rate controllers 24, 25, and 26 are configured to control the flow rates of the raw material gas, carrier gas, and additive gas supplied to the first flow channel 41 into predetermined flow rates, respectively and each can be composed of an automatic valve, for example.

The hot-wall furnace 11 includes a quartz tube 12. In the hot-wall furnace 11, the gas mixture including the raw-material gas, carrier gas, and additive gas supplied from the first flow channel 41 is flown from one of the openings of the quartz tube 12 on the upstream side toward the other opening on the downstream side. The hot-wall furnace includes a not shown heating portion, which maintains a predetermined distribution of temperature within the hot-wall furnace 11.

The hot-wall furnace 11 accommodates plural preforms 100, which are arranged side by side in the direction from the upstream side to the downstream side in the quartz tube 12. The preforms 100 are supplied with the gas mixture of the raw material gas, carrier gas, and additive gas at a predetermined temperature and a predetermined pressure, and silicon carbide (SiC) is deposited on the microstructures of the preforms 100 for film formation.

From the opening of the quartz tube 12 on the downstream side in the hot-wall furnace 11, exhaust gas containing the gas mixture not contributing the film formation of silicon carbide and byproducts concerning the film formation of silicon carbide is discharged to a second flow channel 42. The second flow channel 42 is connected to an automatic valve, which maintains a predetermined pressure within the quartz tube 12 of the hot-wall furnace 11.

The automatic valve 31 is connected to a rotary pump 32 through a third flow channel 43. The rotary pump 32 is configured to discharge the exhaust gas supplied from the third flow channel 43 to a fourth flow channel 44 while providing a predetermined back pressure to the automatic valve 31.

This manufacturing apparatus includes a not-shown controller. The controller controls the raw material gas, carrier gas, and additive gas flow rate controllers 24 to 26 to control the flow rates of the raw material gas, carrier gas, and additive gas supplied through the first flow channel 41 to the hot-wall furnace 11.

The controller detects the temperature within the hot-wall furnace 11 using a not-shown thermocouple provided for the hot-wall furnace 11 and controls a not-shown heating portion to maintain the predetermined temperature within the hot-wall furnace 11. The controller controls the automatic valve 31 to make a control to maintain the predetermined pressure within the quartz tube 12 of the hot-wall furnace 11.

In the first embodiment, the controller controls the flow rates of the raw material gas, carrier gas, and additive gas supplied to the hot-wall furnace 11 to control deposition of silicon carbide on the microstructures of the preforms 100 accommodated in the hot-wall furnace 11. For example, it is possible to set the flow rates of the raw material gas, carrier gas, and additive gas and the ratio of the flow rates thereof and set the amounts of additive gas added to the raw material and carrier gas.

[Compatibility Between Film Formation Rate and Filling Uniformity]

The controller performs the above-described control to support high growth rate of film formed on the microstructures of the preforms 100 and good filling uniformity at film formation at the same time. In other words, the controller ensures through the predetermined growth rate, the mass-productivity of the heat-resistant composite substance composed of the preform 100 impregnated with silicon carbide and, guarantees through the predetermined filling uniformity, the filling of silicon carbide in the microstructure of the preform 100.

Herein, the deposition of silicon carbide on the microstructure of the preform 100 follows a first-order reaction mechanism or a reaction mechanism based on the Langmuir-Hinshelwood rate formula depending on the film forming species to be formed into a film. The control method varies depending on the reaction mechanisms, and the reaction mechanisms are individually described below.

[Case of First-Order Reaction Mechanism]

When the film forming species of silicon carbide follows a first-order reaction mechanism, the growth rate at film formation of silicon carbide is in a first-order relation with the concentration of the film forming species. In this case, the controller makes a control to generate a large amount of film forming species having a low sticking probability. The species having a low sticking probability uniformly stick to the microstructure of preforms, ensuring the filling uniformity at film formation. Moreover, the generation of a large amount of species ensures the growth rate at film formation. Accordingly, it is possible to ensure the compatibility between high growth rate and good filling uniformity.

In order to generate a film forming species having a low sticking probability, the controller controls the raw material gas, carrier gas, and additive gas flow rate controllers 24 to 26 so that the ratio between the flow rates of the raw material gas, carrier gas, and additive gas is set to a predetermined ratio. In other words, the controller makes a control so that only a predetermined amount of the additive gas is added to the raw material gas and carrier gas. Moreover, in order to generate a large amount of film forming species, the controller controls the raw material gas, carrier gas, and additive gas flow rate controllers 24 to 26 to adjust the flow rates of the raw material gas, carrier gas, and additive gas to predetermined flow rates. Furthermore, the controller controls parameters, including the ratio and flow rates of the raw material gas, carrier gas, and additive gas, to optimize the growth rate and filling uniformity.

[Case of Reaction Mechanism Based on Langmuir-Hinshelwood Rate Formula]

In the case where the film forming species of silicon carbide follows the reaction mechanism based on the Langmuir-Hinshelwood rate formula, the growth rate at film formation is saturated with respect to the concentration as the concentration of the film forming species increases, and there is a zero-order reaction area where the growth rate does not depend on the concentration of the film-forming species. The controller makes a control to increase the concentration of the film-forming species to a high concentration not less than a predetermined value so that the concentration of the film-forming species falls in the zero-order reaction area. In the zero-order reaction area of the film-forming species, the growth rate at film formation is constant independently of the concentration, ensuring the filling uniformity at film formation. Moreover, the increase in the concentration increases the growth rate. Accordingly, it is possible to ensure the compatibility between high growth rate and good filling uniformity.

The controller controls the raw material gas, carrier gas, and additive gas flow rate controllers 24 to 26 so that the flow rates of the raw material gas, carrier gas, and additive gas are at a predetermined ratio. In other words, the controller allows only a predetermined amount of additive gas to be added to the raw material gas and carrier gas. Moreover, in order for the concentration of the film-forming species to fall in the zero-order region, the controller controls the raw material gas, carrier gas, and additive gas flow rate controllers 24 to 26 so that the flow rates of the raw material gas, carrier gas, and additive gas are adjusted to predetermined flow rates. Furthermore, the controller controls the parameters, including the ratio and flow rates of the raw material gas, carrier gas, and additive gas, to optimize the growth rate and filling uniformity.

[Etching Effect of Additive Gas]

Irrespective of which reaction mechanism the film-forming species follow, the additive gas containing chlorine has an etching effect, and the effect of etching silicon carbide to be deposited on the microstructure of the preforms 100 is higher in the upstream side where the additive gas is supplied to the quartz tube 12. The etching effect can prevent the microstructure from being clogged at film formation, thus ensuring good filling uniformity at film formation.

[Distribution of Film Formation Rate in Furnace]

On the other hand, in some cases of manufacturing the heat-resistant composite material in an industrial scale, the hot-wall furnace 11 which is as long as about several meters, for example, is provided and accommodates the plural preforms 100 which are arranged side by side from upstream to downstream in the quartz tube 12. Film of silicon carbide is simultaneously formed on the preforms 100.

In the aforementioned case, the controller reduces the growth rate in the upstream side of the quartz tube 12 so that the film formation rate is equal at the plural preforms 100. For example, the controller controls the raw material gas, carrier gas, and additive gas flow rate controllers 24 to 26 and controls the not-shown heating portion to adjust the flow rate of the gas mixture and the distribution of temperature so that the concentration of the film-forming species is low in the upstream and high in the downstream.

The controller makes a control so that the raw-material gas is sufficiently supplied to the downstream. For example, the controller controls the raw material gas, carrier gas, and additive gas flow rate controllers 24 to 26 so that a sufficient flow rate of gas mixture is supplied. Moreover, the gas mixture can be supplied not only from one end in the upstream of the quartz tube 12 but also simultaneously from another supply portion provided between the upstream end and the other end in the downstream of the quartz tube 12.

The controller moreover makes a control to equalize the film formation rate from upstream to downstream and increase the use efficiency of the raw material gas in the supplied gas mixture. For example, the controller can increase the use efficiency of the raw-material gas by properly controlling the parameters, including: the ratio, flow rates, and ways of supply of the raw-material gas, carrier gas, and additive gas supplied to the hot-wall furnace 11; and distributions of temperature and pressure in the hot-wall furnace 11. It is therefore possible to improve the distribution of film formation rate in the hot-wall furnace 11 and reduce the production cost. Moreover, by using the aforementioned parameters, the controller can optimize the use efficiency of the raw-material gas.

The controller used the embodiment can be easily implemented by using a commercially-available micro-controller configured to execute predetermined instructions. Alternatively, the controller can be implemented by executing a predetermined program with a general-purpose personal computer.

In the embodiment, the raw material gas, carrier gas, and additive gas are MTS, hydrogen, and chloride gas, respectively. However, the present invention is not limited to those. The raw-material gas is not limited to MTS but can contain dimethyldichlorosilane ($C_2H_6Cl_2Si$: DDS), trimethylchlorosilane ($C_3H_9SiCl$), silicon tetrachloride ($SiCl_4$), silane ($SiH_4$), propane ($C_3H_8$), or the like. Moreover, the carrier gas is not limited to hydrogen ($H_2$) and may also include noble gas such as nitrogen ($N_2$), helium (He), or argon (Ar).

The additive gas is not limited to hydrochloride (HCl) and can also include molecules containing chlorine. Examples of the additive gas are: chlorine ($Cl_2$), methyl chloride ($CH_3Cl$), dichloromethane ($CH_2Cl_2$), chloroform ($CHCl_3$), carbon tetrachloride ($CCl_4$), vinyl chloride ($C_2H_3Cl$), benzene chloride ($C_6H_5Cl$), silicon tetrachloride ($SiCl_4$), trichlorosilane ($SiHCl_3$), dichlorosilane ($SiH_2Cl_2$), dichloroethylene ($C_2H_2Cl_2$), tetrachloroethane ($C_2H_2Cl_4$), trichloroethane ($C_2H_3Cl_3$), and dichloroethane ($C_2H_4Cl_2$).

The aforementioned molecules containing chlorine can provide molecules containing chlorine, which are adsorbed on the surface of the microstructure of the preforms 100. The molecules containing chlorine adsorbed on the surface of the microstructure lower the probability of sticking of the film-forming species to the microstructure. Accordingly, the filling uniformity at film formation can be ensured.

The additive gas can include acetylene ($C_2H_2$). Alternatively, the additive gas may be gas generating acetylene. For example, the additive gas can include at least one of methane ($CH_4$), ethane ($C_2H_6$), ethylene ($C_2H_4$), methyl chloride ($CH_3Cl$), dichloromethane ($CH_2Cl_2$), chloroform ($CHCl_3$), carbon tetrachloride ($CCl_4$), vinyl chloride ($C_2H_3Cl$), benzene chloride ($C_6H_5Cl$), tetrachloroethane ($C_2H_2Cl_4$), trichloroethane ($C_2H_3Cl_3$), and dichloroethane ($C_2H_4Cl_2$).

Silicon carbide as the film forming species of the first embodiment is generated through a process in which methyltrichlorosilane (MTS) as the raw-material gas is thermally decomposed; and the intermediates of molecules containing carbon and molecules containing silicon are adsorbed on the surface for association and reaction. Herein, acetylene, which is one of molecules containing carbon, has a comparatively inactive structure and has a low sticking probability ($10^{-3}$). Accordingly, by employing acetylene, the total sticking probability is reduced to ensure the filling uniformity, and supply of the film-forming species is accelerated to ensure high growth rate.

The additive gas may include molecules containing carbon having a comparatively inactive structure similarly to acetylene ($C_2H_2$). For example, the additive gas can include at least one of methane ($CH_4$), ethane ($C_2H_6$), and ethylene ($C_2H_4$).

The base material having the microstructure on which silicon carbide is deposited to form a film is the preform 100 of ceramic fibers but is not limited thereto. The base material can be composed of a preform of carbon fibers, a substrate provided with trenches in the surface, or porous ceramics.

EXAMPLE 1

In Example 1, the aforementioned manufacturing apparatus is used, and the quartz tube 12 provided for the hot-wall furnace 11 is used. The quartz tube 12 accommodates a Si (100) substrate with trenches formed in the surface as the base material having a microstructure. The actually-measured aspect ratio of the trenches is 10.9 on average.

On this substrate, silicon carbide is deposited by chemical vapor deposition (CVD) or chemical vapor infiltration (CVI) for film formation. As the growth conditions, the environment in the quartz tube 12 is maintained at a constant temperature of 1000° C. and a constant pressure of 20 Torr. The gas mixture supplied to the quartz tube 12 includes MTS as the raw-material gas, hydrogen ($H_2$) and helium (He) as the carrier gas, and hydrochloride (HCl) as the additive gas. Experiments are performed with three types of gas mixture: samples A, B, and C as shown in Table 1 below. In Table 1, by using the flow rate of MTS as the reference, the other components are shown in terms of relative flow rates. Polygonal lines a, b, and c in Table 1 represent the corresponding relations with data in FIGS. 3 to 6 described later.

TABLE 1

| | He (ARBITRARY UNIT) | $H_2$ (ARBITRARY UNIT) | HCL (ARBITRARY UNIT) | POLYGONAL LINE |
|---|---|---|---|---|
| A | 9 | 2.5 | 0 | a |
| B | 8.5 | 2.5 | 0.5 | b |
| C | 8 | 2.5 | 1.0 | c |

Figure 2:
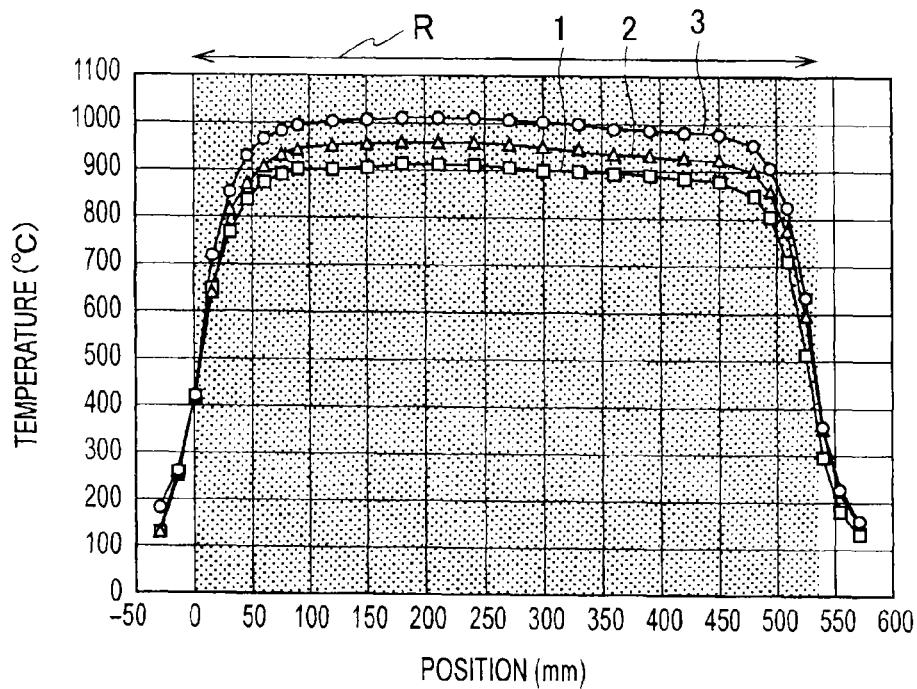
FIG. 2 is a diagram showing a distribution of temperature in a hot-wall furnace.

FIG. 2 is a diagram showing the distribution of temperature in the hot-wall furnace 11. The hot-wall furnace 11 is provided with a 500 mm long heater extending in the longitudinal direction of the quartz tube 12 as the heating portion. The heater is movable between 0 mm at the inlet and 540 mm at the outlet along the quartz tube 12. In FIG. 2, the region between the inlet and outlet is indicated by a region R.

The temperature within the hot-wall furnace 11 can be controlled by the not-shown controller. Polygonal lines 1 to 3 of FIG. 2 represent really-measured results of temperature when the temperature of the hot-wall furnace 11 is set by the controller to 900, 950, and 1000° C., respectively. The temperature is set by using thermocouples provided along the quartz tube 12. As shown in FIG. 2, the set temperature is achieved with high accuracy in most of the region R, where the heater is movable, excepting portions in the inlet and outlet sides.

Figure 3:
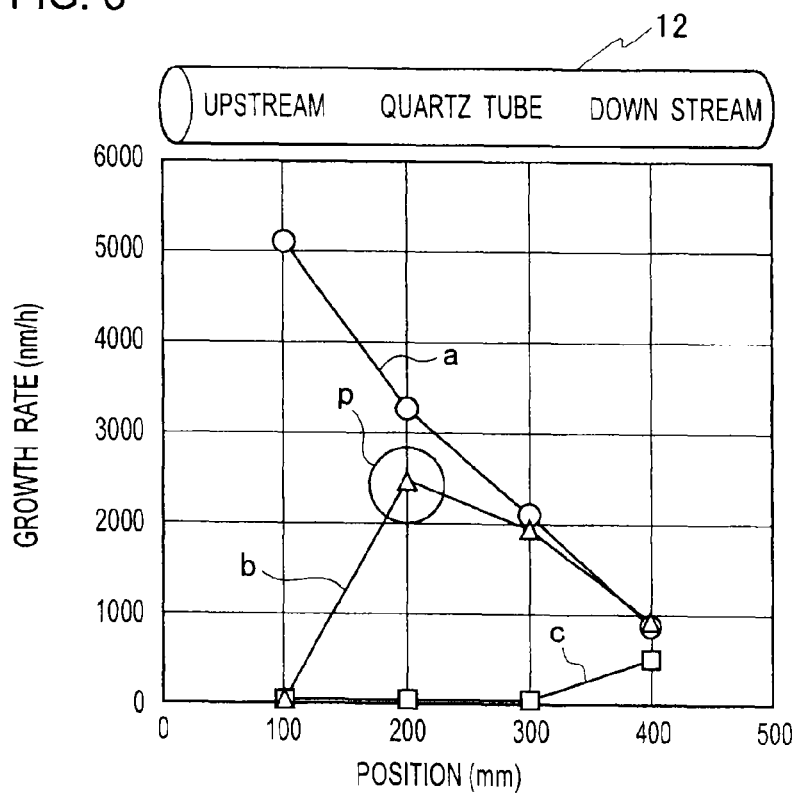
FIG. 3 is a diagram showing a distribution of growth rate in the hot-wall furnace.

FIG. 3 is a diagram showing the distribution of growth rate at film formation in the hot-wall furnace 11. The horizontal axis of FIG. 3 gives a location in the quartz tube 12, which is provided in the hot-wall furnace 11, in the direction from upstream to downstream of the flow of the gas mixture. The same applies to FIGS. 4 to 6 below. The vertical axis in FIG. 3 gives the growth rate at film formation of silicon carbide.

Polygonal lines a, b, and c in FIG. 3 respectively correspond to the samples A, B, and C which vary in the amount of hydrochloride as the additive gas added in the gas mixture. The sample A does not contain the additive gas. The sample B contains a small amount of hydrochloride, and the relative flow rate thereof is 0.5. The sample C contains a large amount of hydrochloride, and the relative flow rate thereof is 1.0. The same goes in FIGS. 4 to 6 below.

As apparent from FIG. 3, as the amount of hydrochloride added increases, the growth rate at film formation lowers, and the peak in the distribution of flow rate shifts downstream. This is considered to be because a large amount of hydrochloride is adsorbed to the base material and prevents film formation in the upstream.

Figure 4A:
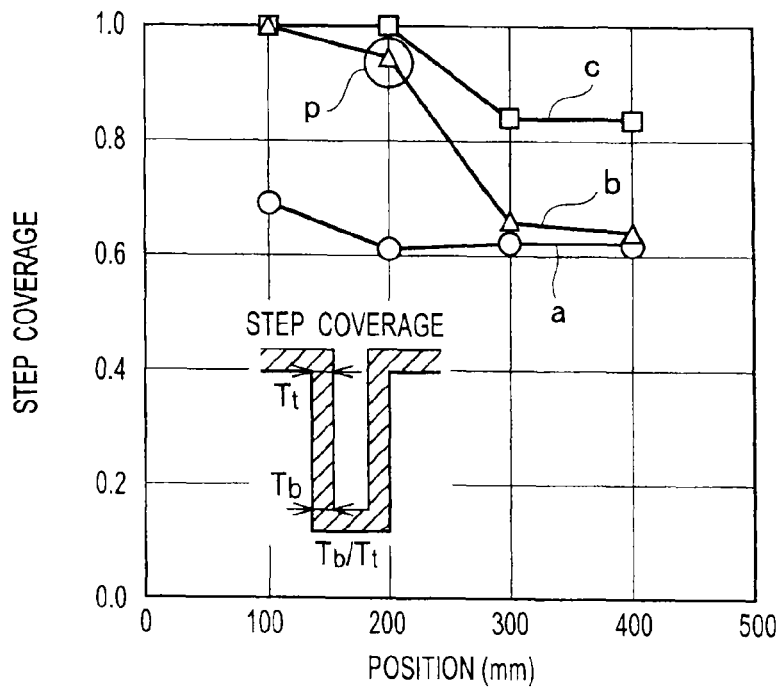
FIGS. 4A and 4B are diagrams showing distributions of step coverage and sticking probability in the hot-wall furnace.
Figure 4B:
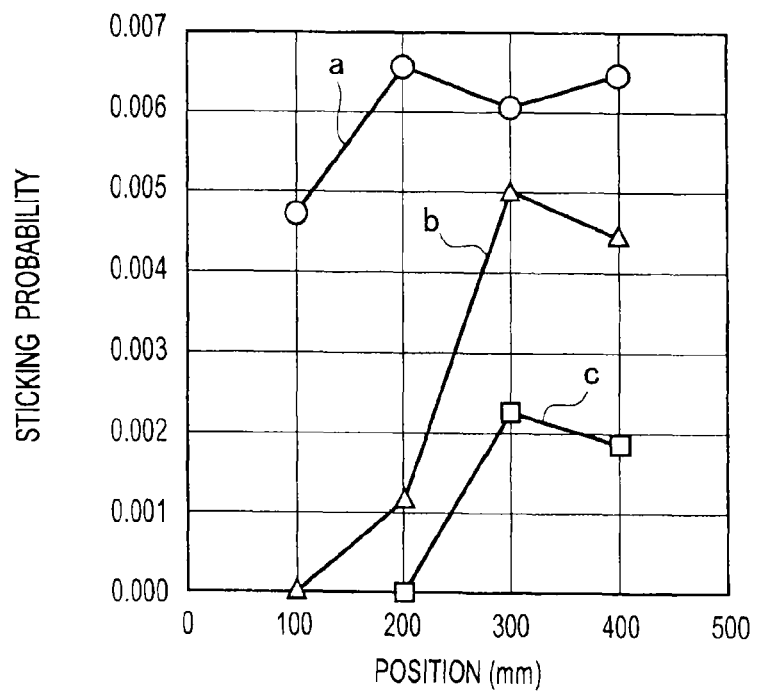

FIGS. 4A and 4B are diagrams showing distributions of step coverage and sticking probability in the hot-wall furnace 11. Herein, the step coverage represents the filling uniformity at film formation and is given by a ratio of Tb/Tt where Tb and Tt are film thicknesses at the top opening and at the bottom constituting the microstructure as illustrated in FIG. 4A. As apparent from FIG. 4A, the step coverage increases as hydrochloride as the additive gas increases while increasing towards the upstream side where a larger amount of hydrochloride is expected to be adsorbed.

The comparison between FIGS. 3 and 4A shows the followings: the growth rate is high at a point p of the polygonal line b in FIG. 3, that is, at 200 mm in the case of the sample B, and at the point p of FIG. 4A, the step coverage is high, that is, high filling uniformity is implemented. In other words, high growth rate and good filling uniformity are supported at the same time under the conditions of the point p.

FIG. 4B shows the sticking probability calculated from the step coverage. Herein, the calculation is performed by assuming that one type of film forming species is included for good vision. As a result, it is found that the sticking probability can reach the order of $10^{-4}$ by introducing hydrochloride of the additive gas.

Figure 5A:
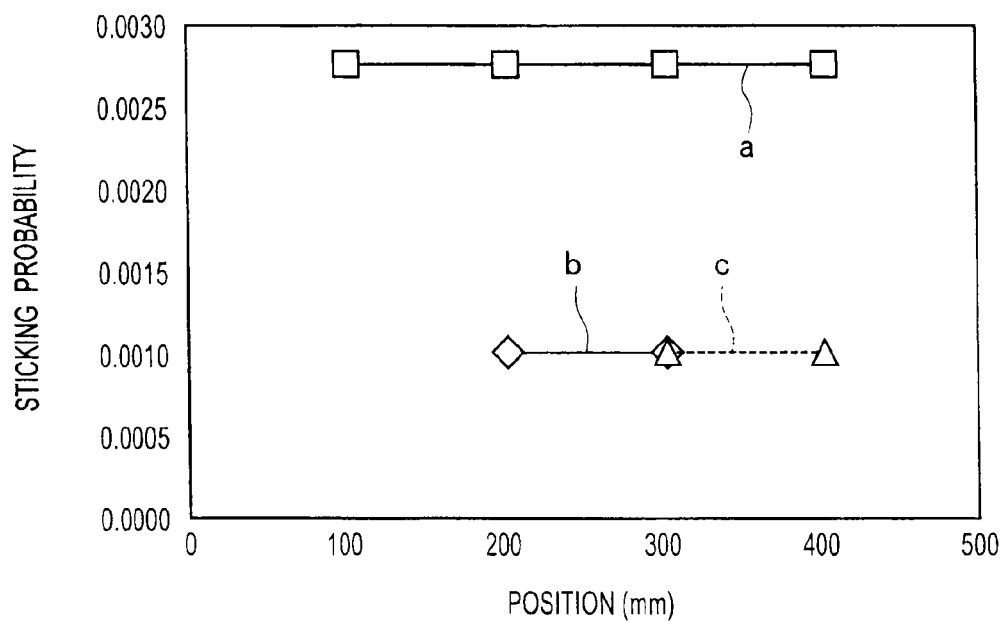
FIG. 5 is a diagram illustrating a concrete example of the sticking probability.
Figure 5B:
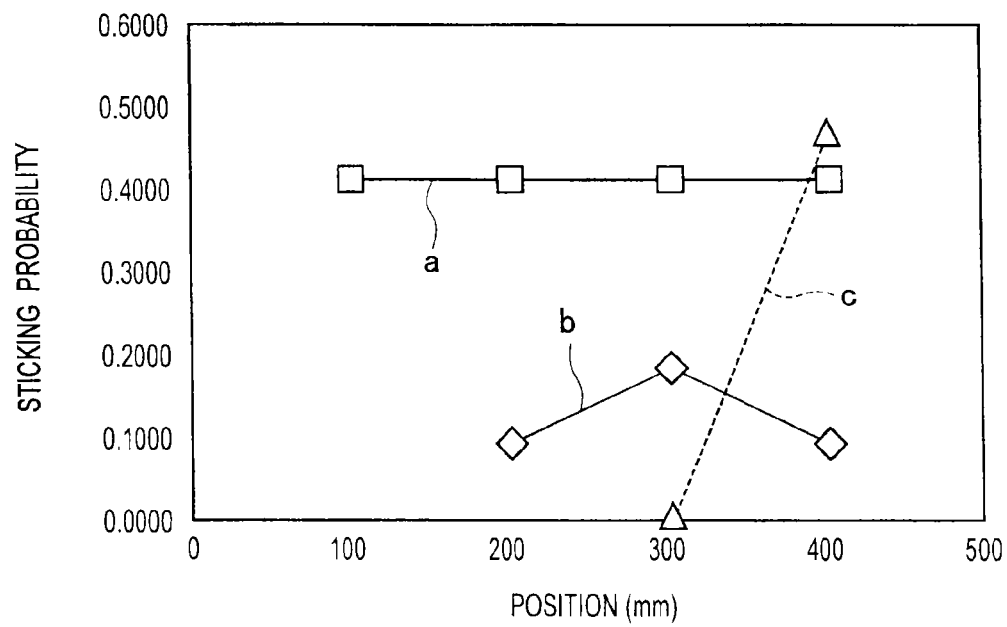

FIGS. 5A and 5B are diagrams showing specific examples of the sticking probability. FIG. 5A shows the result for a first film-forming species, and FIG. 5B shows the result for a second film-forming species. In terms of sticking probability of both the first and second film forming species, there is a tendency for the polygonal line a to be the highest, followed in order by the polygonal lines b and c. It is therefore found that the introduction of hydrochloride can lower the sticking probability. In the case of the first film-forming species, the polygonal line b corresponding to the relative flow rate of hydrochloride of 0.5 and the polygonal line c corresponding to the relative follow rate of hydrochloride of 1.0 reach an sticking probability of 0.001 which corresponds to the limit of the aspect ratio of the trench.

Figure 6A:
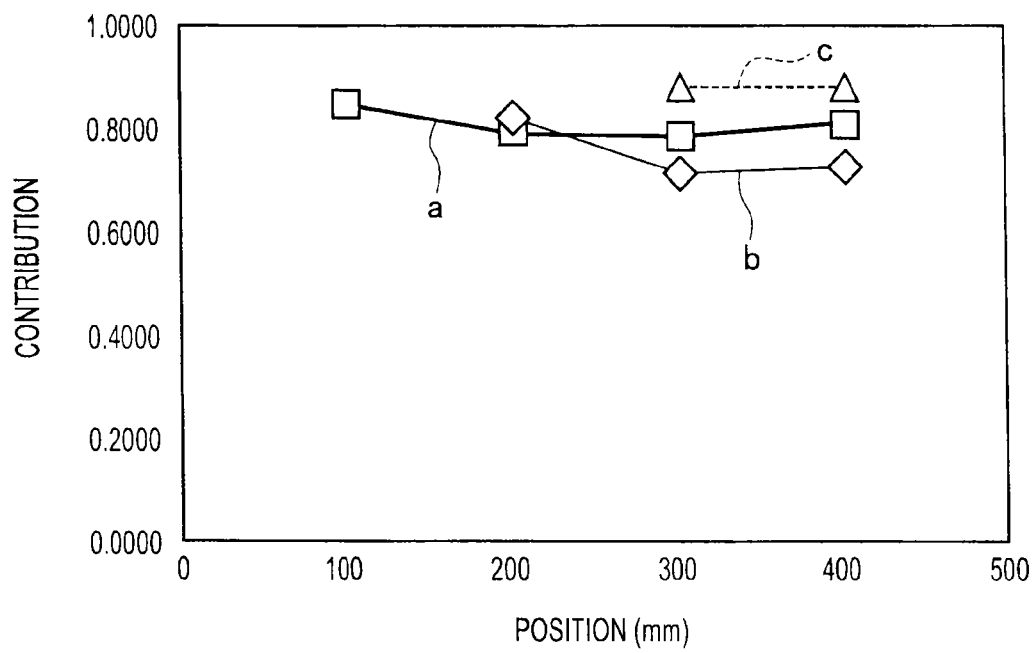
FIGS. 6A and 6B are diagrams illustrating concrete examples of contribution.
Figure 6B:
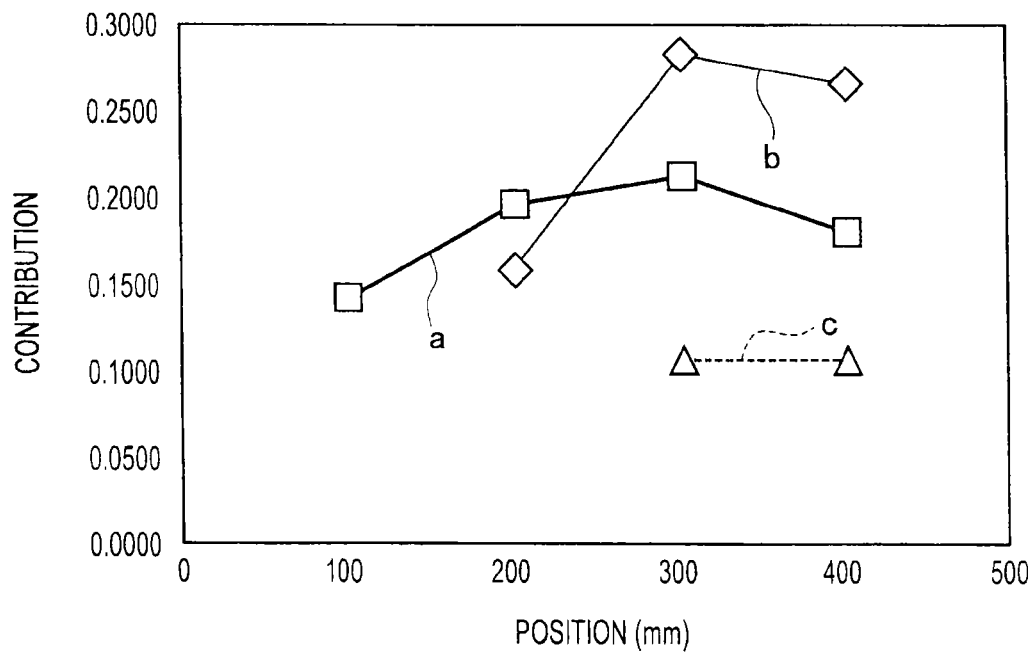

FIGS. 6A and 6B are diagrams showing specific examples of contribution. As for the first film-forming species shown in FIG. 6A, the contribution is substantially constant at nearly 1 irrespective of whether hydrochloride is introduced. On the other hand, as for the second film-forming species, the contribution is smaller than 1 and depends on whether hydrochloride is introduced.

Figure 7:
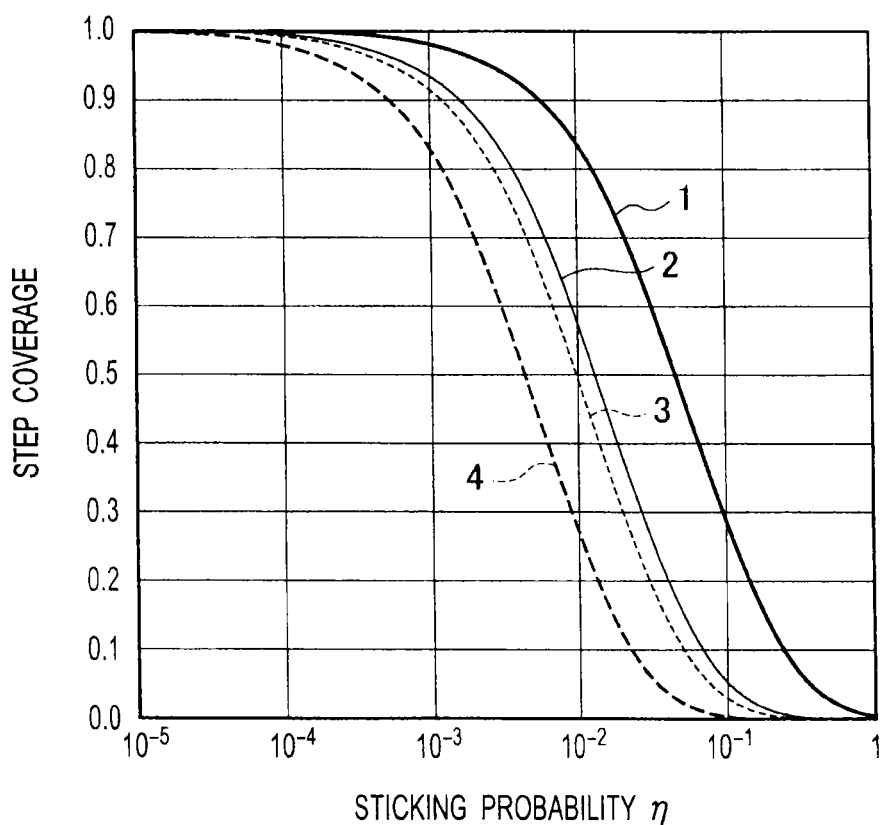
FIG. 7 is a diagram illustrating dependences of step coverage on the aspect ratio and sticking probability.

FIG. 7 is a diagram showing the dependences of the step coverage on the aspect ratio and sticking probability. Curves 1 to 4 in FIG. 7 correspond to aspect ratios 4.7, 9.1, 10.7, and 16.5, respectively. By using various aspect ratios, the sticking probability can be set in an analyzable range of $10^{-4}$ to 1.0. Simultaneously, the aspect ratios can be used to classify plural film-forming species having different sticking probabilities.

EXAMPLE 2

In Example 2, the additive gas is methyl chloride ($CH_3Cl$), and experiments are performed with three types of gas mixture: samples D, E, and F as shown in Table 2. As the growth conditions, the environment within the quartz tube 12 has a temperature of 1000° C. The other conditions are the same as those of Example 1. Lines d, e, and f in Table 2 represent the corresponding relations with data in FIGS. 8A and 8B described later. In table 2, by using the flow rate of MTS as the reference, the other components are shown in terms of relative flow rates.

TABLE 2

| | He (ARBITRARY UNIT) | $H_2$ (ARBITRARY UNIT) | $CH_3Cl$ (ARBITRARY UNIT) | POLYGONAL LINE |
|---|---|---|---|---|
| D | 2.3 | 1.1 | 0 | d |
| E | 2.3 | 1.1 | $8.10 \times 10^{-3}$ | e |
| F | 2.3 | 1.1 | $4.0 \times 10^{-2}$ | f |

Figure 8A:
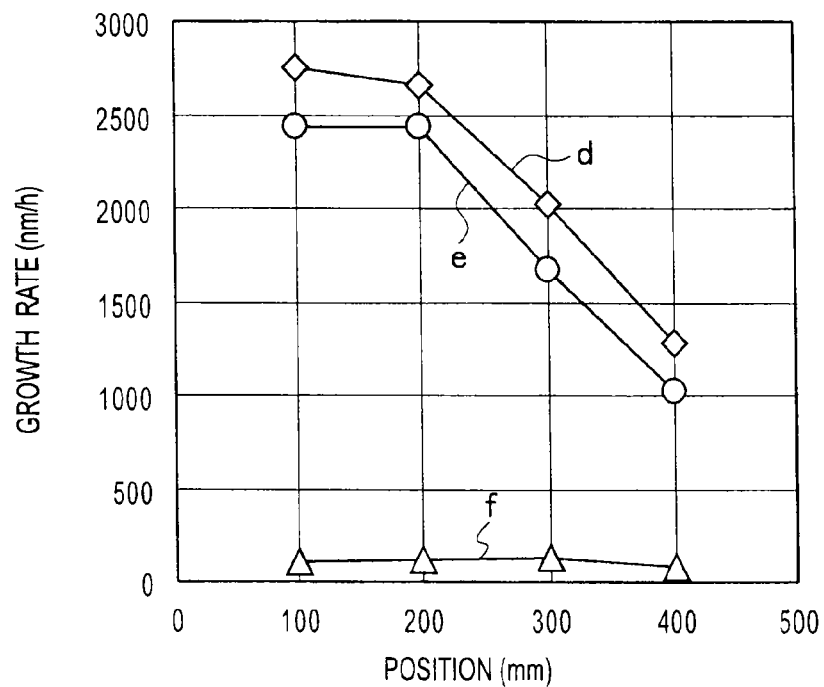
FIGS. 8A and 8B are diagrams illustrating the distributions of growth rate and sticking probability in the hot-wall furnace, respectively.
Figure 8B:
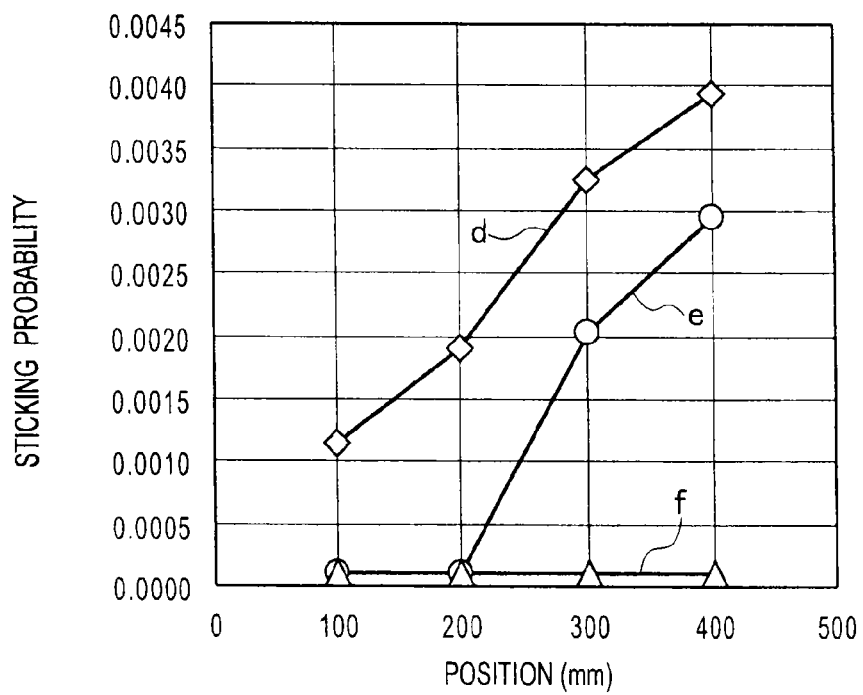

FIG. 8A is a diagram showing the distribution of growth rate at film formation in the hot-wall furnace 11, and FIG. 8B is a diagram showing the distribution of sticking probability in the hot-wall furnace 11. Polygonal lines d, e, and f in FIGS. 8A and 8B correspond to the samples D, E, and F which vary in the amount of methyl chloride as the additive gas added in the gas mixture as shown in Table 2. The sample D does not contain the additive gas. The sample E contains a small amount of methyl chloride, and the relative flow rate thereof is $8.1 \times 10^{-3}$. The sample C contains a large amount of methyl chloride, and the relative flow rate thereof is $4.0 \times 10^{-2}$.

As apparent from FIGS. 8A and 8B, the experiment with the relative flow rate of methyl chloride of $8.1 \times 10^{-3}$, which is represented by the polygonal line e, results in high growth rate of thin film and low sticking probability. The growth rate and sticking probability have very good values especially at the positions of 100 and 200 mm. This result reveals that both high growth rate and good filling uniformity at film formation of silicon carbide are implemented.

EXAMPLE 3

Figure 9A:
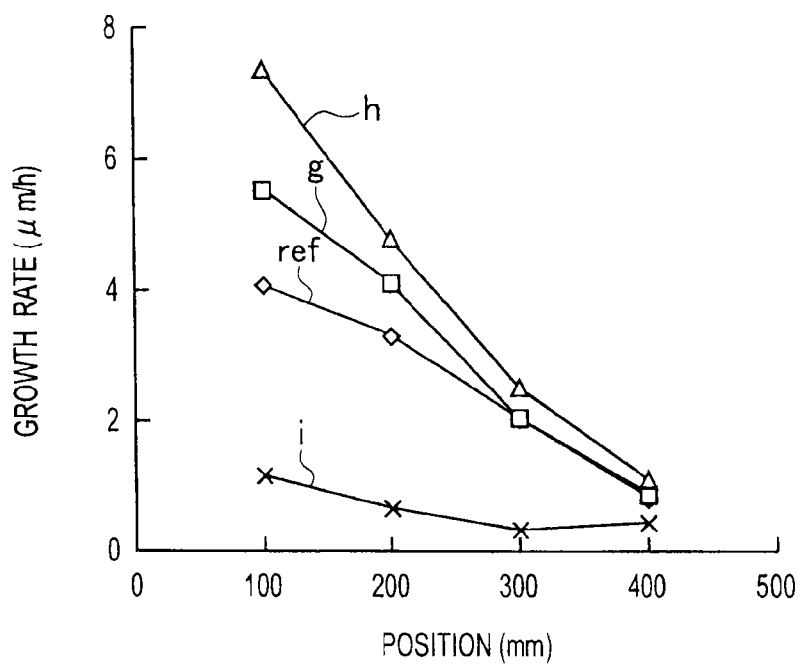
FIGS. 9A and 9B are diagrams respectively illustrating the distributions of growth rate and sticking probability when acetylene is added.
Figure 9B:
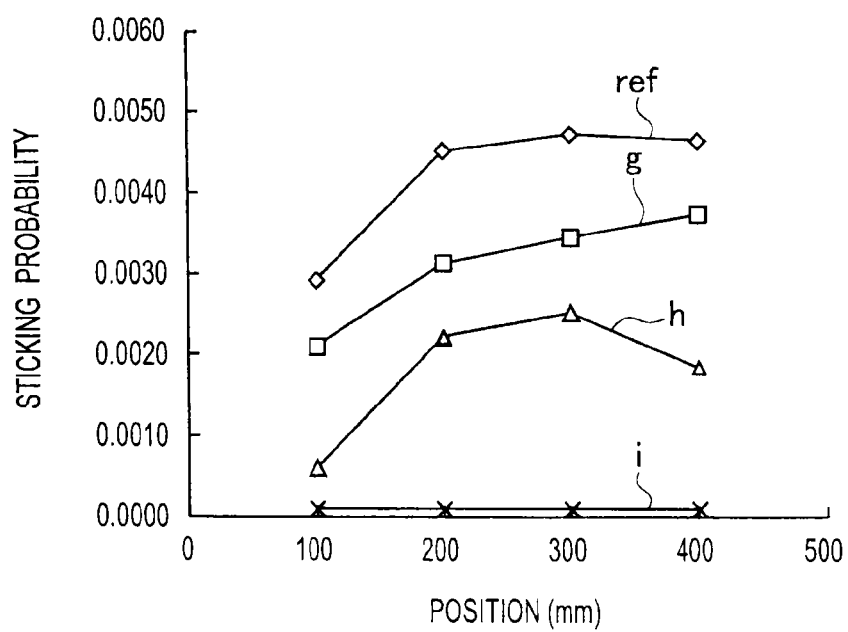

In Example 3, the additive gas is acetylene ($C_2H_2$), and experiments are performed with four types of gas mixture in Table 3. Herein, Ref indicates a sample with the concentration of acetylene set to 0 for comparison. Polygonal lines g, h, and Ref in Table 3 represent the corresponding relations with data in FIGS. 9A and 9B described later.

Similarly to Example 2, the environment within the quartz tube 12 is set to a temperature of 1000° C. The other conditions are the same as those of Example 1. The same applies to the following example.

TABLE 3

| | He (ARBITRARY UNIT) | $H_2$ (ARBITRARY UNIT) | $C_2H_2$ (ARBITRARY UNIT) | POLYGONAL LINE |
|---|---|---|---|---|
| G | 8.2 | 3.0 | $2.4 \times 10^{-2}$ | g |
| H | 8.1 | 3.0 | $1.3 \times 10^{-1}$ | h |
| I | 7.7 | 3.0 | $4.9 \times 10^{-1}$ | i |
| Ref | 8.2 | 3.0 | 0.0 | ref |

As shown in FIG. 9, when acetylene is added, the effect of reducing the sticking probability and increasing the film-forming rate can be confirmed.

Preferably, the relative flow rate of acetylene to MTS does not exceed $4.9 \times 10^{-1}$. However, the optimal relative flow rate depends on the absolute pressure of MTS. The optimal relative flow rate needs to be set at each condition.

EXAMPLE 4

Figure 10A:
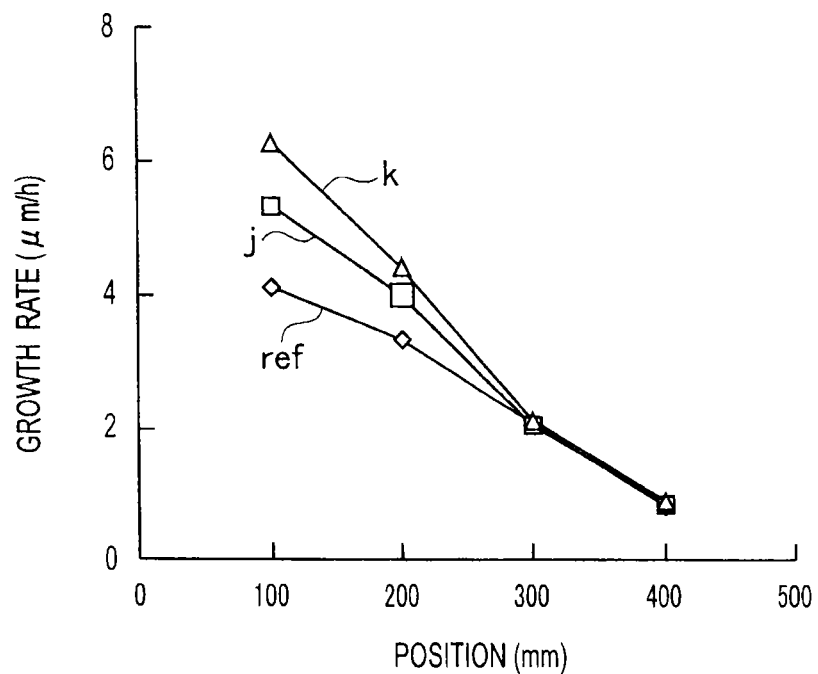
FIGS. 10A and 10B are diagrams respectively illustrating the distributions of growth rate and sticking probability when methane is added.
Figure 10B:
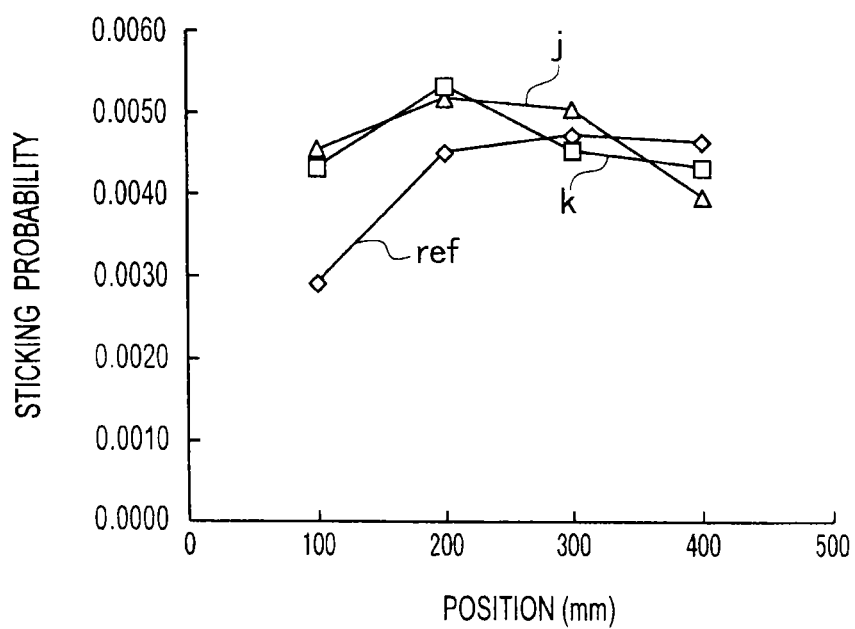

In Example 4, the additive gas is methane ($CH_4$), and experiments are performed with three types of gas mixture in Table 3. Herein, Ref indicates a sample with the concentration of methane set to 0 for comparison. Polygonal lines j, k, and Ref in Table 4 represent the corresponding relations with data in FIGS. 10A and 10B described later.

TABLE 4

| | He (ARBITRARY UNIT) | $H_2$ (ARBITRARY UNIT) | $CH_4$ (ARBITRARY UNIT) | POLYGONAL LINE |
|---|---|---|---|---|
| J | 8.0 | 3.0 | $1.8 \times 10^{-1}$ | j |
| K | 7.6 | 3.0 | $5.4 \times 10^{-1}$ | k |
| Ref | 8.2 | 3.0 | 0.0 | ref |

As shown in FIG. 10, the addition of methane is effective on increasing the film-forming rate without changing the sticking probability very much.

The embodiment and examples of the present invention described above show just examples to which the present invention is applied, and the present invention is not limited to those.

INDUSTRIAL APPLICABILITY

The present invention is applicable to manufacturing of heat-resistant composite materials and manufacturing of mechanical parts, high-temperature resistant semiconductors, and high voltage-resistant power devices including the heat-resistant composite materials.

EXPLANATION OF REFERENCE NUMERALS

11 HOT-WALL FURNACE
12 QUARTZ TUBE
21 RAW MATERIAL GAS SUPPLY SOURCE
22 CARRIER GAS SUPPLY SOURCE
23 ADDITIVE GAS SUPPLY SOURCE
24, 25, 26 FLOW RATE CONTROLLER
31 ROTARY PUMP
100 PREFORM

What is claimed is:
1. A method of manufacturing a heat-resistant composite material, which uses chemical vapor deposition or chemical vapor infiltration to cause raw material gas and carrier gas to flow in a reaction furnace accommodating a base material having a microstructure and deposit silicon carbide on the base material for film formation, the method comprising:

determining, according to a film-forming species, whether the film formation follows a first-order reaction or a Langmuir-Hinshelwood rate formula;

further adding additive gas to the raw material gas and carrier gas, the raw material gas including silicon and carbon; and adjusting the amount of the added additive gas to control growth rate and filling uniformity at the film formation of silicon carbide, by controlling sticking probability of the film-forming species to the base material for the film formation following the first-order reaction, or by controlling so that a zero-order reaction region of the Langmuir-Hinshelwood rate formula is used for the film formation following the Langmuir-Hinshelwood rate formula, wherein the additive gas includes at least one of hydrochloride, methane chloride, and hydrocarbon gas, and using a flow rate of the raw material gas as a reference, a flow rate of hydrochloride relative to the flow rate of the raw material gas is 0.5 or more times the flow rate of the raw material gas, a flow rate of methane chloride relative to the flow rate of the raw material gas is 0.0081 or more times the flow rate of the raw material gas, or a flow rate of hydrocarbon gas relative to the flow rate of the raw material gas is 0.13 or more times the flow rate of the raw material gas.

2. The method of manufacturing a heat-resistant composite material according to claim 1, wherein the growth rate and filling uniformity at the film formation of silicon carbide are optimized.

3. The method of manufacturing a heat-resistant composite material according to claim 1, wherein the amount of the added additive gas is adjusted to control the distribution of growth rate at the film formation of silicon carbide with respect to the position in the reaction furnace.

4. The method of manufacturing a heat-resistant composite material according to claim 3, wherein the distribution of growth rate is optimized to be uniform.

5. The method of manufacturing a heat-resistant composite material according to claim 3, wherein the raw material gas is supplied through a plurality of positions located from upstream to downstream in the reaction furnace.

6. The method of manufacturing a heat-resistant composite material according to claim 1, wherein the raw material gas includes at least one of methyltrichlorosilane, dimethyldichlorosilane, and trimethylchlorosilane.

7. The method of manufacturing a heat-resistant composite material according to claim 1, wherein the carrier gas includes at least one of hydrogen, nitrogen, helium, and argon.

8. The method of manufacturing a heat-resistant composite material according to claim 1, wherein the raw material gas is methyltrichlorosilane and a flow rate of acetylene relative to the flow rate of methyltrichlorosilane does not exceed $4.9 \times 10^{-1}$ times the flow rate of methyltrichlorosilane.

9. The method of manufacturing a heat-resistant composite material according to claim 1, wherein the additive gas has an etching operation.

10. The method of manufacturing a heat-resistant composite material according to claim 1, wherein the base material includes at least one of a preform of fibers, a substrate provided with a trench, and a porous substrate.

11. The method of manufacturing a heat-resistant composite material according to claim 1, wherein the reaction furnace is a hot-wall furnace.

12. The method of manufacturing a heat-resistant composite material according to claim 1, wherein the hydrocarbon gas is acetylene or methane, and using the flow rate of the raw material gas as a reference, a flow rate of acetylene relative to the flow rate of the raw material gas is 0.13 or more times the flow rate of the raw material gas, or a flow rate of methane relative to the flow rate of the raw material gas is 0.18 or more times the flow rate of the raw material gas.

13. The method of manufacturing a heat-resistant composite material according to claim 12, wherein the raw material gas includes methyltrichlorosilane.

14. The method of manufacturing a heat-resistant composite material according to claim 1, wherein the raw material gas includes methyltrichlorosilane.

* * * * *